(12) United States Patent
Borens et al.

(10) Patent No.: US 8,104,309 B2
(45) Date of Patent: Jan. 31, 2012

(54) METHOD AND CASTING MOLD FOR MANUFACTURING A QUARTZ GLASS BODY

(75) Inventors: Manfred Borens, Mainz (DE);
Franz-Peter Eckes, Bubenheim (DE);
Janus Zborowski, Ingelheim (DE);
Karsten V. Westernhagen, Mainz (DE);
Stefano Merolla, Mainz (DE); Joerg Witte, Pfungstadt (DE); Joachim Kuester, Erzhausen (DE); Marcus Holla, Biebelnheim (DE)

(73) Assignee: Schott AG, Mainz (DE)

( * ) Notice: Subject to any disclaimer, the term of this patent is extended or adjusted under 35 U.S.C. 154(b) by 156 days.

(21) Appl. No.: 11/961,515

(22) Filed: Dec. 20, 2007

(65) Prior Publication Data
US 2008/0153688 A1 Jun. 26, 2008

(30) Foreign Application Priority Data

Dec. 21, 2006 (DE) .................. 10 2006 060 561

(51) Int. Cl.
C03B 20/00 (2006.01)
B28B 1/26 (2006.01)
(52) U.S. Cl. ......................... 65/17.3; 264/87
(58) Field of Classification Search .................. 65/17.3; 264/87
See application file for complete search history.

(56) References Cited

U.S. PATENT DOCUMENTS

| | | | | |
|---|---|---|---|---|
| 1,336,180 A * | 4/1920 | Allen et al. | | 264/87 |
| 2,669,762 A * | 2/1954 | Blackburn et al. | | 264/335 |
| 3,034,192 A * | 5/1962 | Maillard | | 264/87 |
| 3,431,332 A | 3/1969 | Cummings | | |
| 3,481,010 A | 12/1969 | Colburn et al. | | |
| 3,848,040 A * | 11/1974 | Confer et al. | | 264/86 |
| 4,416,680 A * | 11/1983 | Bruning et al. | | 65/144 |
| 4,812,278 A * | 3/1989 | Natori et al. | | 264/221 |
| 6,165,398 A | 12/2000 | Matsumoto et al. | | |
| 2005/0156345 A1 * | 7/2005 | Hume | | 264/86 |
| 2007/0082149 A1 * | 4/2007 | Linnot et al. | | 428/34.4 |

FOREIGN PATENT DOCUMENTS

| | | |
|---|---|---|
| DE | 26 41 975 | 3/1978 |
| DE | 102 44 040 | 12/2003 |
| DE | 102 51 076 | 5/2004 |
| EP | 0 475 549 | 3/1992 |
| EP | 0 572 280 | 12/1993 |
| EP | 1 516 864 | 3/2005 |
| JP | 2-9604 | 1/1990 |
| WO | 2005/016837 | 2/2005 |
| WO | 2006/089754 | 8/2006 |

* cited by examiner

*Primary Examiner* — Matthew Daniels
*Assistant Examiner* — Erin Snelting
(74) *Attorney, Agent, or Firm* — Michael J. Striker (57) ABSTRACT

The method provides an improved quartz glass body, especially an improved quartz glass crucible for melting non-metals, non-ferrous metals, or silicon. The quartz glass body is made by a method in which a quartz glass-water mixture is supplied to a gypsum casting mold comprising an outer part and an inner part, dried in the gypsum mold, and put under an overpressure via a system of ducts in the form of textile tubes embedded in the mold during the drying. Later a resulting green glass body is removed from the mold. At least a portion of the shaping surfaces of the inner part of the gypsum mold are surfaces of a water-impermeable substance. The method provides a cast body with a reduced tendency to crack and with a smaller open porosity.

19 Claims, 4 Drawing Sheets

METHOD AND CASTING MOLD FOR MANUFACTURING A QUARTZ GLASS BODY

CROSS-REFERENCE

The invention described and claimed herein below is also described in German Patent Application 10 2006 060 561.6-45, filed on Dec. 21, 2006, in Germany, whose subject matter is hereby incorporated by reference thereto. This German Application provides the basis for a claim of priority under 35 U.S.C. 119 (a)-(d).

BACKGROUND OF THE INVENTION

1. The Field of the Invention

The present invention relates to a method and casting mold for manufacture of a quartz glass body and to an improved quartz glass body, especially a container or crucible for melting non-metals or non-ferrous metals and especially for manufacture of a silicon ingot or block, from which photovoltaic modules are made.

2. The Related Art

Containers made of sintered quartz glass are predominantly used for making silicon blocks. These containers and/or molded parts and their manufacturing processes are disclosed, for example in DE 102 51 076 or DE 102 44 040. The containers are essentially made with the following process steps:

1. preparing a quartz glass-water mixture, a so-called slip, with quartz of a predetermined gain size (inorganic solid $SiO_2$) and with a predetermined ratio of quartz glass and water;
2. introducing the quartz glass-water mixture into a casting mold, typically a gypsum mold, which has an outer part and an inner part;
3. drying the quartz glass-water mixture in the casting mold, whereby the water is drawn from the quartz glass-water glass mixture and diffuses into the gypsum of the casting mold; and
4. removing the resulting green glass body from the gypsum mold.

Problems always occur according to experience during removal of the green glass body from the gypsum mold, especially when a large-sized container is involved. These problems are handled, for example, in DE 102 51 076. There the use of a container assembled from a number of plates is suggested instead of a finished cast quartz glass container.

Another problem results because it is often desired to provide the container wall that comes in contact with the melted material with a fine-grained textured structure. Because of that the strength of this sort of container suffers. This problem is discussed in DE 102 44 040 and is solved there by building the container up from several layers, which include a fine-grain layer that faces the melted material and a coarse-grained layer next to that layer that faces away from the melted material.

Furthermore a casting mold for making the cast body is disclosed in WO 2006/089754 or EP 1516864 A2. This casting mold has a liquid-impermeable mold wall, in order to prevent water loss through this mold wall.

Finally the green glass body is sintered after removal to form a stable container.

Basically both the hollow casting method and the casting-with-a-core method can be used for casting. Both methods are known and used in the prior art for manufacture of quartz glass crucibles of the above-described type. Normally in the hollow casting method a gypsum mold, which exactly defines the later outer contour of the crucible, is filled with the slip mass. After a predetermined time interval of several minutes to hours, a solid layer that is several mm thick has been deposited on the mold inner surface according to the composition of the slip and the size of the mold. The residual portion of the still flowing slip is removed from the mold and can be used for a subsequent casting. The layer remaining in the mold is subsequently sintered.

In this method the mold must not be completely filled with the slip mass. It is sufficient to partially fill the mold and to completely wet the surfaces of the mold with the slip mass by rotating or swinging the mold for that purpose. Thus a suitable layer is built up on the mold wall.

In an additional variant of this method a mold, which has the inner contour or shape of the container to be made, is immersed in a suitable container with the slip mass until a layer of the desired thickness has been deposited on the outer side of the mold.

Figure 6A:
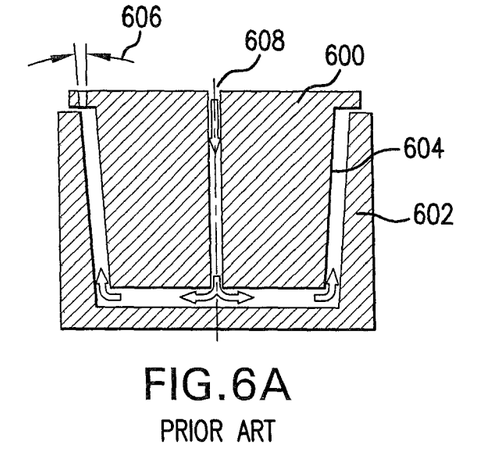
FIGS. 6A to 6C are respective schematic illustrations showing slip casting with casting molds according to the prior art.
Figure 6B:
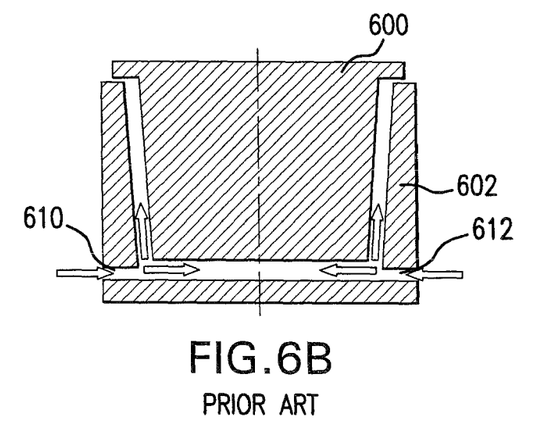
Figure 6C:
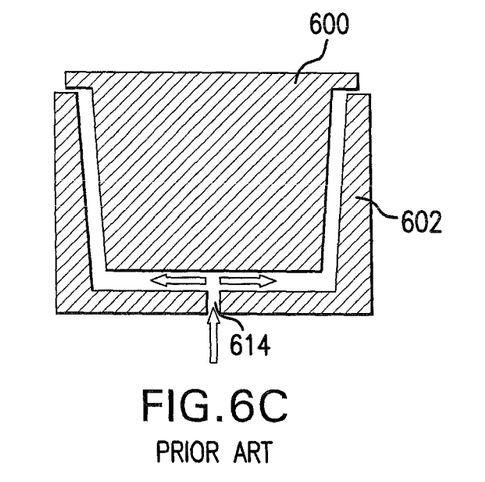

The casting-with-a-core method is illustrated in FIGS. 6A to 6C. The slip casting mold has a core 600 and an outer part 602, between which a gap-shaped shaping chamber 604 is formed, in which the slip mass is filled. The walls of the casting mold are conical with an angle 606 for easy removal. The shaping surfaces of the casting mold can be provided in a known manner with a separating agent, in order to prevent the adherence of the dried slip mass with the shaping surfaces. Graphite powder or wax is used as the separating agent. The layer thickness of the separating agent must not prevent or only hinder in an insignificant manner the uptake of water by the mold. It must also be guaranteed that the separating agent does not close the pores of the gypsum mold.

These slip casting molds can be round, square, rectangular, or polygonal. They have a diameter of up to 1200 nm and a height of up to 1400 mm. The wall thickness defined by the gap-shaped shaping chamber 604 amounts to between 6 and 250 nm according to the size of the container to be manufactured. The method of the slip casting mold is typically gypsum or clay in a few cases.

The casting with a central drilled-through core is illustrated in FIG. 6A. The slip mass is filled into the shaping chamber through the central through-going passage 608. At the same time air is removed from the chamber through the gap between the core 600 and the outer part 602. The advantage of filling the mold through a central through-going passage in the core is a uniform distribution of the mass; the highly isotropic mass in the mold leads to uniform shrinkage during sintering. The disadvantage of this casting mold is that the slip must pass over a long flow path within the casting mold and this presupposes a corresponding high castability or pourability. This property must be considered during formulation of the slip.

In the casting mold according to FIG. 6B the slip is fed into the mold through at least two or more openings 610, 612 distributed as symmetrically as possible around the outer surface of the outer part 602. The air in the chamber is removed as before through the gap between the core 600 and the outer part 602. In the simplest variant the introduction of the slip occurs at only one corner (not shown). In that case a very long flow path and a corresponding non-uniform and asymmetrical filling of the mold results. In contrast to that the case shown in FIG. 6B has the problem that a so-called flow front can result at the place where the individual material flows are combined. At this place the bottom of the container that is produced can be inhomogeneous and especially susceptible to crack formation and breakage.

FIG. 6C shows another known embodiment, in which the slip is filled into the mold through a central opening 614 in the bottom of the outer part 602. Again the air removal occurs through the gap between the core 600 and the outer part 602. The advantages and disadvantages are similar to those of the embodiment shown in FIG. 6A, but the flow path is slightly shorter in the case of this embodiment.

There is a further embodiment in which a casting mold of basically the same structure is supplied from over head, which means a core arranged below and an outer part covering over it. In addition to the supply openings air escape openings are provided in the now upper base region of the outer part, since the gap between the core and the outer part is now directed downward and is closed by the slip mass at the start of the slip casting process.

The problems resulting from the prior art methods include air inclusions, which occur when the material flows together ("flow front"), because the air cannot not escape and is included in the material. Furthermore the container formed by the casting method must be put under a reduced load or reduced stress at the flow front location, which also can be caused by contamination of the slip mass by separating agent residues mixed with it. A high castability is required on account of the long flow path. To attain this high castability the slip must have a minimum water content, which is provided by drying the slip mass. Because of that the container produced can have a high porosity and/or a reduced material density. As a result, there is a danger of crack formation because of the drying, which is especially great in the vicinity of material accumulations in the corners or in the bottom region of the container.

SUMMARY OF THE INVENTION

It is an object of the present invention to provide an improved quartz glass body and a method, a casting mold and an apparatus for its manufacture, which facilitate a reliable supply and simple removal from the mold and thus provide a reliable manufacturing process for a quartz glass container or crucible.

This object and others, which will be made more apparent hereinafter, are attained in a method of making a quartz glass body, which comprises the steps of:

a) feeding a quartz glass-water mixture into a casting mold, which comprises an outer part and an inner part, the inner part having shaping surfaces for contacting the quartz glass-water mixture;

b) drying the quartz glass-water mixture in the casting mold;

c) during the drying of step b), applying an overpressure to the quartz glass-water mixture; and d) removing a resulting green glass body from the casting mold.

According to the invention the method is characterized by the overpressure applied to the quartz glass-water mixture during the drying of the quartz glass-water mixture and by an inner part in which at least a part of the shaping surfaces are formed from a water-impermeable substance.

According to the invention a slip cast and sintered quartz glass cast body including less than 15% by volume of pores can be produced by the foregoing method of the invention and its preferred embodiments. A silicon block or ingot can advantageously be made using the quartz glass cast body embodied as a quartz glass crucible.

The casting mold used in the method according to the invention to make the quartz glass crucible comprises an outer shell and a core, in which at least a portion of the shaping surfaces of the core, which come in contact with the slip mass, are formed from a water-impermeable substance and the casting mold has a filling connector above an upper crucible edge and an inlet opening at the crucible bottom region.

Of course WO 2006/089754 discloses both the use of a silicone rubber component as the inner part and compressed air acting on the outer part. However the silicone rubber is provided because there is a danger of breakage of a water-absorbing inner part and to provide easy removal from the mold. The compressed air is used first after drying in order to facilitate removal in a known way.

For the first time according to the invention an overpressure is used during drying in combination with water-impermeable shaping surfaces of an inner part made from silicone rubber and polyurethane. A polyurethane inner part is particularly preferred. It has been established that an overpressure on the slip during drying produces a compact and homogeneous structure so that the tendency to crack is significantly reduced. The overpressure on the slip is responsible for a rapid removal of the excess water in a direction toward the outer part in a first drying phase, so that inhomogeneities in a form characterized as "cloud structures", which form during slower drying processes, cannot form. Furthermore the flow resistance of the slip mass along the water-tight surfaces is reduced. Because of that the casting is quicker and at the same time the slip mass produces no wear and less contamination, e.g. by separating agent residues, of the casting mold (gypsum, etc). This leads to an improved product quality. Furthermore the water removal can be controlled in one direction. The fine fraction of the glass particulate used in the slip manufacture preferably settles on the side, from which the water is removed. A tighter or denser surface arises there. However this effect does not negatively influence the tendency to form cracks and especially plays no role in the crucible manufacture for the silicon work. Components of the gypsum dissolve in the water, which is drawn from the slip, and diffuse into the green glass body. This effect is similarly avoided by the watertight shaping surfaces on the critical inner side. The surface of the quartz glass body (crucible, container, plate or the like) formed on this side has a considerably higher purity or cleanliness, especially a reduced content of alkali and alkaline earth metal impurities.

A pressure drop from the interior to the exterior does not stand in the way of water removal to the outer part, since the diffusion and capillary forces responsible for that are substantially higher than the forces produced by the overpressure.

A further advantage of the invention relates to the purity of the cast body. While the purity (and/or impurities) in the bulk portion of the cast body is primarily currently determined by the purity of the raw material, the impurities in its surface region, i.e. within a surface layer of about 2 mm thick, strongly influence the casting process. Both together lead to an impurity content on the surface of clearly more than about 0.3 percent by weight for standard purity raw materials and clearly more than about 0.2 percent by weight for highly pure raw materials in the known manufacturing method. The content of impurities based only on the purity of the raw material is less than 0.2 percent by weight for the standard raw materials and less than 0.1 percent by weight for the highly pure raw material. This corresponds also to the values in the interior of the cast body. However that means that the impurities introduced by the casting process are significant and put limits on the purity of the cast body, even using very expensive highly pure raw materials.

The methods according to the present invention make it possible to considerably reduce the content of the impurities of the cast product that are caused by the casting process in contrast to the prior art. Cast bodies can be produced by the methods according to the present invention, which have impurity content in the surface region of less than 0.2 percent by weight and preferably less than 0.1 percent by weight. According to the quality of the raw material the impurities in the surface region can even be less than 0.07 percent by weight and with especially careful application of the methods of the invention even less than 0.04 percent by weight. The content of impurities in a surface layer of about 2 mm thick, which is removed, were analysed for their components.

The cladding is a matter of a smooth water-impermeable or watertight layer.

Cladding a gypsum mold with inserted or cut in watertight mats can provide shaping surfaces forming the water-impermeable surfaces. The casting mold can be clad with a preferably one-piece prefabricated mold, which is made from a water-impermeable substance, in another advantageous embodiment. For this purpose, prefabricated injection-molded molds made of plastic, particular made from silicone rubber or polyurethane (PU), are especially suitable.

According to an alternative embodiment the casting mold can be at least partially coated with a watertight or waterproof substance. This can occur by sealing, washing, and foam forming. Beeswax, for example, can provide a watertight coating, which must be applied so thick that the coating is watertight by closing the pores in the casting mold. Furthermore lacquer can be applied to the casting mold as the watertight coating. Both lacquer based on a plastic resin and lacquer with an acrylic base can be used for this purpose.

In another alternative embodiment of the method, which utilizes a casting mold with an outer part and an inner part, the latter inner part comprises a combustible material, which is later burned out in a sintering process. The combustible material can be a plastic material, such as Styropore or preferably polyurethane (PU) foam. Furthermore also natural materials, such as corn products, can be used. In this way manual removal of the core can be dispensed with, whereby the manufacturing process is simplified and made more economical. Furthermore inclined removal surfaces can be eliminated and inner contour can even be provided with an undercutting and less waste arises because of damage during removal.

All forms of water-impermeable mold surfaces allow the manufacture of crucibles, which especially have surfaces structures on their inner surfaces, which are suitable for adherence of a coating, e.g. a powder coating or an emulsion. For this purpose claddings with complementary structures can be used.

Besides the overpressure that acts on the quartz glass-water mixture during drying, a pressure difference is set up also across the casting mold during removal and/or already during introducing the quartz glass-water mixture, when the casting mold is exposed to an overpressure or an underpressure. The process is accelerated already by applying the pressure to the slip. The same goes for the application of an under-pressure across or over the casting mold.

An additional advantage results during removal of the green glass body: the green glass body is more easily released from the mold by the presence of an overpressure. For example a low or under pressure can be present on the outer part and an overpressure on the inner part to facilitate removal of the inner part. Thus the angle of an inclined surface provided to facilitate removal can be minimized. Likewise the pressure behavior can be reversed in order to release the green glass body from the outer part.

The cast body according to the invention is not limited to a certain shape. The cast body can be a flat plate. A plurality of such plates can e.g. be assembled to form a melting crucible. In the case of the melting crucible the portion of the casting mold whose shaping surfaces come in contact with the melt or melted material to form the surfaces of the cast body are to be understood as the "inner part". However the casting mold is preferably equipped for manufacture of a quartz glass crucible as cast body, when it has a core as inner part and an outer shell as outer part. The quartz glass-water mixture is introduced or filled into the casting mold under the assistance of gravity from a level above the upper crucible edge, on which a filling connection device (funnel tube or container) of the casting mold is arranged, through an inlet or entrance opening in the casting mold in the vicinity of the crucible bottom, which is connected by a tubing or pipe connection with the filling connection device. Thus a one-piece crucible, which is preferred over a crucible that is assembled from several parts for reasons of water-tightness or impermeability, can be made.

It has been shown that crack formation is reduced when the inlet opening is arranged in the vicinity of a transition from the crucible bottom to the crucible wall, also in the vicinity of the edges and especially preferably in the vicinity of the corners of the crucible.

The hydrostatic pressure produced in this way can be used then as an overpressure, which acts on the quartz glass-water mixture during drying in order to achieve the desired homogenizing and sealing of the slip. The hydrostatic pressure may be easily adjusted by selection of the filling height above the upper crucible edge.

In an alternative embodiment the casting mold has a duct system formed by hollow cavities or spaces in the outer part and at least one connector for connection of a compressed medium, preferably compressed air. Thus it can be acted on with an overpressure. The duct system is preferably in the form of at least one woven tube embedded in the casting mold. This may be easily provided by casting the at least one woven tube in the gypsum mold. The duct system should be below, but as close as possible to, the shaping surfaces of the casting mold, without endangering their stability. In this way the pressure difference is only applied over a comparatively short distance and the pressure gradient is large. This increases the efficiency of the apparatus, especially when the casting mold material has a comparatively high flow resistance.

The overpressure applied through the duct system can also be combined with the hydrostatic pressure in an advantageous manner.

An overpressure on the slip mass, which is produced in one way or another, is preferably from 0.002 to 0.14 MPa (0.09 to 1.4 bar), especially preferably from 0.01 to 0.02 MPa (0.1 to 0.2 bar) over standard pressure.

Since crack formation is increased when the solids content of the quartz glass-water mixture is increased or the water content is decreased, the known method would typically work with solids content in the slip mass of only between 70% and 85%. However water withdrawn from the slip mass during drying left undesirable pores or air inclusions in the finished dried quartz glass material, whose frequency and size increased with the original water content and which were a threat to the stability of the cast body.

In contrast in the method according to the invention it is now possible to make a cast body from a quartz glass-water mixture, which has water content of 15% by weight or less, when it is introduced into the casting mold. A reduced water content of at most 12% by weight, preferably at most 10% by weight, and especially preferably at most 7% by weight, is desirable in order to attain the lowest possible open porosity in the cast body. The reduced water content is a burden on workability, which however is guaranteed up to a water content of 5% by weight without addition of flow improving substances (e.g. polyethylene glycol or methyl cellulose). Flow improving substances are especially to be avoided in melt vessel manufacturing. Residual carbon-containing compounds or residual carbon can be detected in the finished crucible because of their use, even after sintering. This residual carbon produces an undesirable gas formation when the crucible is used, e.g. in the silicon or glass melt, since the crucible is used to contain these melts. Gas formation then leads to an increased bubble count in the melt product and/or to a general impairment of the solidification process. A good compromise between the workability and the porosity is obtained with a water content is between 9.5 and 11.5% by weight.

As a result the dried cast body has a substantially reduced content of pores or air inclusions but a small tendency to crack. The porosity of the resulting cast body amounts to less than 15% by volume, preferably less than 10% by volume, and especially preferably less than 8% by volume, and at the same time carbon residue introduced by flow improving substances is avoided.

It has proven to be advantageous when the casting mold under the overpressure is completely filled over a time interval of not more than one hour. The filling time can vary according to the amount of the required quartz glass-water mixture and should be kept as short as possible. It is preferably between 10 minutes and 30 minutes. The filling time can amount to 5 minutes in the case of very small crucibles, for vary large crucibles up to one hour. A filling time of about 30 minutes is desired in the case of crucibles with edge lengths between 400 mm and 750 mm, heights between 270 mm and 500 mm, and wall thicknesses between 8 mm and 35 mm.

According to a preferred embodiment of the method according to the invention the overpressure acts on the quartz glass-water mixture during a first stage of the drying. The inner part is lifted from the dried green glass body during a second stage of the drying. This happens in the casting mold for the crucible, when the core is withdrawn from the green glass body a sufficient distance, so that it is no longer in contact with the material already stabilized and pre-dried in the first stage. However it still closes the mold sufficiently so that convection of room air is avoided. That would cause surface drying that is too rapid and a high crack formation danger as a result. The purpose for the lifting of the inner part is that adherence to the inner part caused by shrinkage of the cast body is avoided and thus the danger of breakage on removal is avoided. The outer part is held close to the already solidified cast body so that an overpressure can be maintained through or across the outer part of the mold.

The first stage of the drying, in which the core is completely anchored in the mold and stays in contact with the slip, is preferably completed after a time interval of between 2 and 24 hours. The duration of the first drying stage is about 10 hours in the case of crucibles with edge lengths between 400 mm and 750 mm, heights between 270 mm and 500 mm, and wall thicknesses between 8 mm and 35 mm.

The second stage of the drying is preferably between 10 hours and 12 days. For the above-mentioned crucible sizes the second drying stage is preferably between 36 hours and 3 days in length. Drying times of 10 to 24 hours are sufficient for very small crucibles. With very large crucibles or with crucibles with very great wall thicknesses of greater than 35 mm durations of up to 12 days and even longer are necessary. After that the semi-finished product or molded blank is removed from the mold and burned.

The casting mold can be vibrated during input of the quartz glass-water mixture to help perform the method. The apparatus for making the quartz glass container preferably has a shaking device, which is equipped for receiving and vibrating the casting mold, in addition to the casting mold.

The filling of the casting mold can be definitely improved by vibrating the entire mold. The entire mold structure is mounted on a shaking table and vibrated.

The filling of the mold can clearly be improved because of that. The number of pores is clearly smaller. The method is especially advantageous when parts with large surface area and small wall thickness are made and when the density and porosity of the material should be reduced.

The vibration frequency is preferably between 0.1 Hz and 25 Hz, especially between 1 Hz and 5 Hz. The vibration amplitude is preferably between 0.25 mm and 20 mm and especially preferably between 1 mm and 3.5 mm.

The optimum frequency range and optimum amplitudes depend on the part sizes, the surface area/wall thickness ratio of the parts, and the type of the slip, e.g. the grain size distribution of the initial glass grains, the water content, and the trace element content of the alkali, and on the weight of the mold including the fill weight. Especially amplitudes over 20 mm can lead to destruction of the mold, while amplitudes under 0.25 mm have little effect.

The vibration or shaking of the casting mold can preferably be combined with a method according to the first aspect of the invention, namely with a cladding with a water-impermeable substance, and/or with a method according to a second aspect of the invention, namely the use of a pressure difference.

In special cases with a casting mold with a core and an outer part a first part of the quartz glass-water mixture forming a first layer on the surface of the outer part or core is first dried and subsequently the casting mold including the first dried layer is assembled, before a second part of the quartz glass-water mixture is introduced into the remaining molding space in the casting mold and is dried to form a second layer.

In this way the casting of the quartz glass crucible occurs in an economically satisfactory manner in a second method step, in which the crucible inner shell or the crucible outer shell is produced already by means of the inner or outer part of the casting mold and is put together with it in the closed casting mold before the casting of the quartz glass crucible is finished. The outer part can be filled and, after formation of a solid water-poor boundary layer on the inner wall of the outer part, the fluid residual slip can be poured out in order to form the first layer. Alternatively the process can also be reversed when the core is dipped in a container with the slip mass or washed with the slip mass until a solid water-poor edge layer has been formed around it.

The first and second parts of the quartz glass-water mixture have different compositions according to the particular application. For example, the slip used on the inner side of the quartz glass container can have a high purity or a fine-grained structure, in order to attain improved surface quality and/or purer composition of the substance to be melted in the quartz glass container.

Especially an economical and still slightly impure crucible can be made, when the raw material on its inner side has an especially high purity and a conventional economical raw material is used for the outer side. Thus a crucible may be made in an economical method according to the invention, which has a very pure side surface for contacting the melted material, when standard raw materials are used for the outer region of the container or crucible in combination with improved high purity of materials for the contacting surfaces based on the cladding of the casting mold.

Also it can be advantageous to form the crucible inner shell from a layer, which contains from 0.1% by weight to 8% by weight of silicon and/or silicon nitride additives, which is clearly above a fraction of possible impurities, but is not so great that the casting process is unstable. Preferably the fraction of silicon and/or silicon nitride is at least 0.15% by weight and not higher than 5% by weight. Especially preferably it is not more than 2% by weight and most preferably not more than 1% by weight.

Preferably after formation of a first layer it is coated with an intermediate layer in an at least piece-wise or section-wise manner. The intermediate layer preferably comprises a fiber layer, a fiber cloth, a fiber woven article, a fiber mat or felt. The intermediate layer preferably contains fibers selected from the group consisting of glass fibers, carbon fibers, metal fibers and ceramic fibers. For example, the ceramic fibers can be silicon carbide fibers or aluminum oxide fibers. The intermediate layers can also comprise a metal screen.

The ability of the quartz glass container to bear a load can be increased by this sort of intermediate layer, without changes in the composition of the slip and especially without tolerating a higher porosity of the slip. Especially the corners of the container or the bottom region of the container can be strengthened in this way so that higher loads can be tolerated. Alternatively, the wall thickness of the container can be reduced at the same load.

Only a limited use of multiple molds has been possible up to now because of the limited flowability of the quartz glass slip. The use of multiple molds leads to a clearly poorer container quality or to a reduced yield for containers with dimensions from 650 mm×650 mm×350 mm with wall thickness of less than 28 mm. Because water removal starts immediately in the method of the invention the flow front rapidly looses its flowability. Of course this can be compensated by higher water content in the slip. However then the shrinkage of the slip is so large during drying that shrinkage cracks arise.

The methods according to the invention and apparatus according to the invention now permit manufacture of a quartz glass crucible with dimensions of 550 mm×550 mm×350 mm (height) or more, with wall thicknesses less than 20 mm, preferably less than 18 mm, especially preferably less than 15 mm and even less than 12 mm, and with bottom thicknesses of less than 24 mm, preferably less than 20 mm, especially less than 18 mm, and with spacial care even less than 15 mm, in many cases even less than 12 mm.

With the method according to the invention crucible sizes with the following dimensions and above-mentioned wall thicknesses may be obtained:
1. 720 mm×720 mm×500 mm
2. 850 mm×850 mm×600 mm
3. 1200 mm×1200 mm×650 mm.

Since the method according to the invention can be performed using multiple molds, the entire casting process can be performed more economically.

BRIEF DESCRIPTION OF THE DRAWING

The objects, features and advantages of the invention will now be illustrated in more detail with the aid of the following description of the preferred embodiments, with reference to the accompanying figures in which.

DESCRIPTION OF THE PREFERRED EMBODIMENTS

Figures 1, 2:
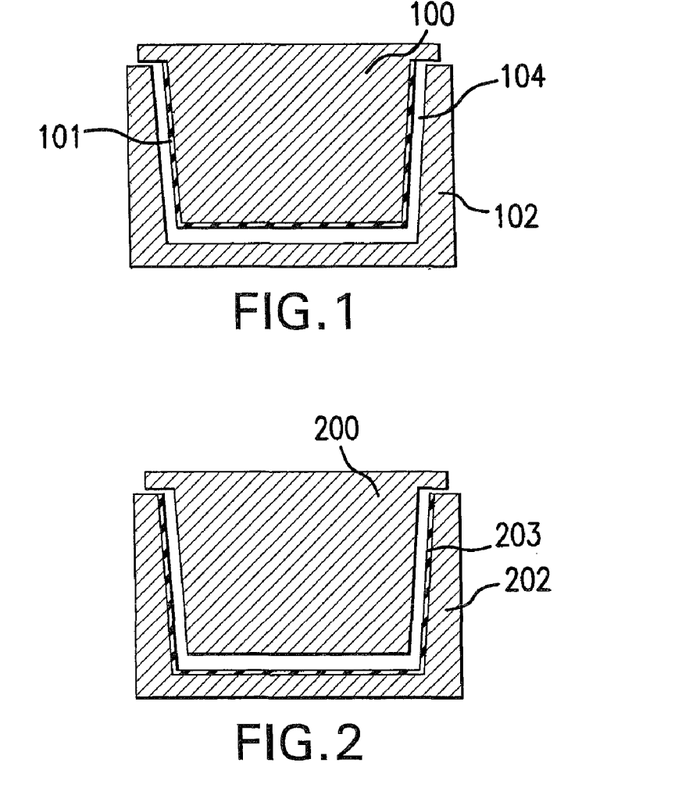
FIG. 1 is a sectional view through a first embodiment of a mold according to the invention with an encased or clad core.
FIG. 2 is a sectional view through a second embodiment of a mold according to the invention with an encased or clad outer part of the mold.

FIG. 1 is a schematic cross-sectional view through a casting mold according to the present invention. The casting mold comprises two parts, a core 100 and an outer part 102. The molding or shaping chamber 104 is between the core 100 and the outer part 102. The core 100 is clad or encased with a one-piece protective coating 101. The coating 101 comprises a watertight or water-impermeable material. It conforms to the shape of the core 100 and was prepared in this form, for example in an injection molding process. Silicone rubber is the preferred material for the coating 101. A silicone rubber coating with a thickness of 5 mm and a hardness of 60 Shore A has a sufficient strength for the present application.

The casting mold according to FIG. 2 is similarly shown in a cross-section view according to FIG. 2 and has a core 200 and an outer part 202. In this case the outer part 202 is coated with a pre-made cladding 203. The cladding 203 is made in one-piece and advantageously comprises silicone rubber with a preferred thickness of about 5 mm and a hardness of about 60 Shore A. The material thickness and hardness of the silicone rubber cladding or of the silicone rubber coating can vary between preferably 3 mm to 7 mm and between 40 Shore A and 80 Shore A according to the size of the casting mold. Smaller and greater hardness is of course possible in principle however disadvantages regarding workability, supportability, and flow behavior of the slip result.

Figure 3:
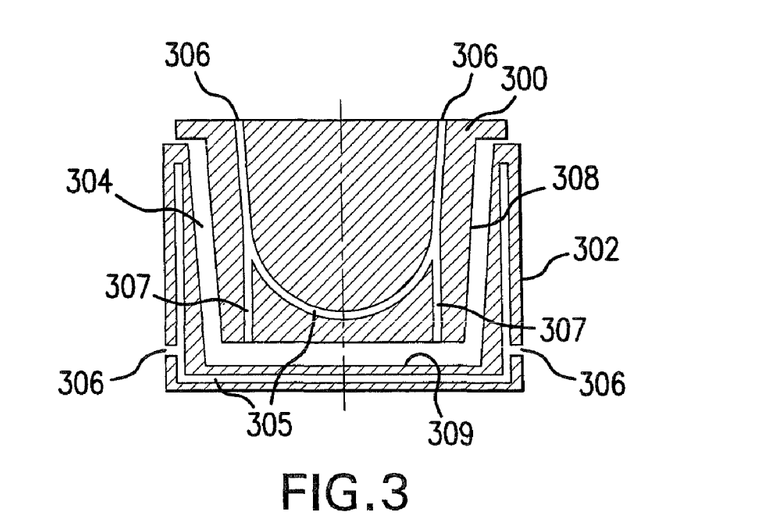
FIG. 3 is a sectional view through a third embodiment of a casting mold equipped with a duct system.

Another embodiment of the casting mold according to a second aspect of the present invention is shown in FIG. 3. The casting mold has a core 300 and an outer part 302. Ducts 305 are provided both in the core 300 and in the outer part 302. These ducts open into openings 306 on the outer side of the core 300 and/or the outer part 302 and have unshown connecting means for connection with a pumping device. In this way the ducts can be acted on with an overpressure or an under-pressure (vacuum). A flow direction of the fluid, preferably air, is provided by the pressure difference. According to the invention the overpressure is set at 0.002 to 0.14 MPa (0.02 to 1.4 bar) and an under-pressure is set at 0.001 to 0.09 MPa (0.01 to 0.9 bar), measured relative to standard pressure.

The ducts or channels are preferably cast in the casting mold in the form of textile tubes during its manufacture. They extend, as shown in FIG. 3, near the shaping surfaces 308 and 309 of the core 300 and the outer part 302, in order to produce the pressure drop as efficiently as possible in the space in the shaping chamber 304. Additional branches 307 from the ducts or channels 305 are provided in the illustrated embodiment, which end at the corners of the core 300, in order to produce an overpressure or under pressure there as close as possible to the shaping surface 308.

Figure 4A:
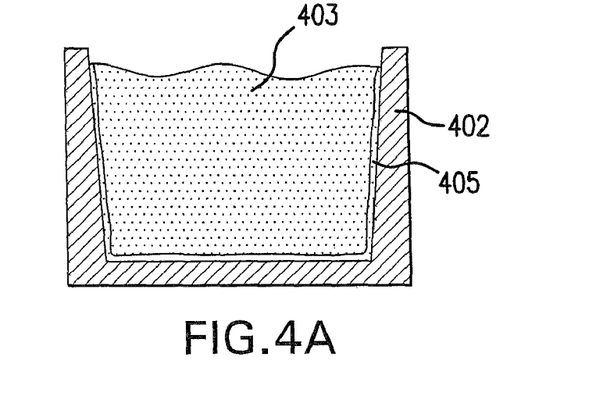
FIGS. 4A to 4C are respective schematic illustrations, showing steps of a manufacturing process for making a multi-layer quartz glass container.
Figure 4B:
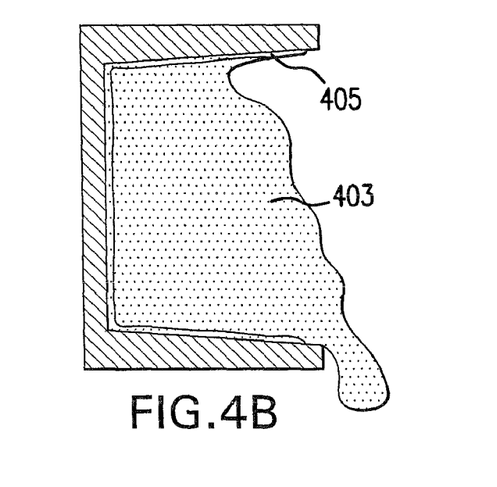
Figure 4C:
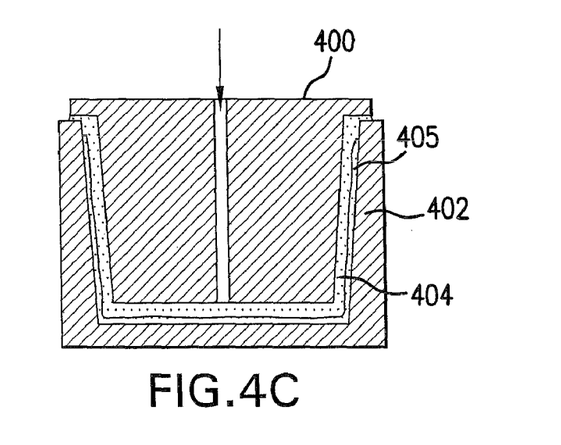

In FIGS. 4A to 4C three steps of the method of making a quartz glass container made from at least two layers are outlined. In FIG. 4A (step a) the outer part 402 of the cast container is filled with the slip mass, which is already dried at the edge region 405 after a short time of a few minutes to hours, because there the water diffuses into the gypsum of the outer part 402.

After that the still fluid residual slip mass 403 is poured out from the outer part (step 2) as shown in FIG. 4B. The solid edge region 405 having a low water content remains in the outer part and forms a first layer of the quartz glass container. The poured-out still fluid slip mass 403 can be used again for the next casting.

The casting mold comprising the outer part 402 and the core 400 is shown assembled in FIG. 4C. The shaping chamber 404 remaining between the dried first layer 405 and the core 400 of the casting mold is then filled with a second portion of the quartz glass-water mixture and dried (step 3), as shown in FIG. 4C. The composition of the first portion and the second portion of the quartz glass-water mixture can be different. Moreover an intermediate layer, especially in the mechanically highly loaded or stressed region of the container, can be applied to the first layer prior to assembly of the casting mold. This intermediate layer can comprise, as mentioned previously, laid fibers, woven fibers, knit fibers, braided fibers, or a fiber mat, and can comprise different fibers. An intermediate layer is not shown in FIG. 4C.

Figure 5:
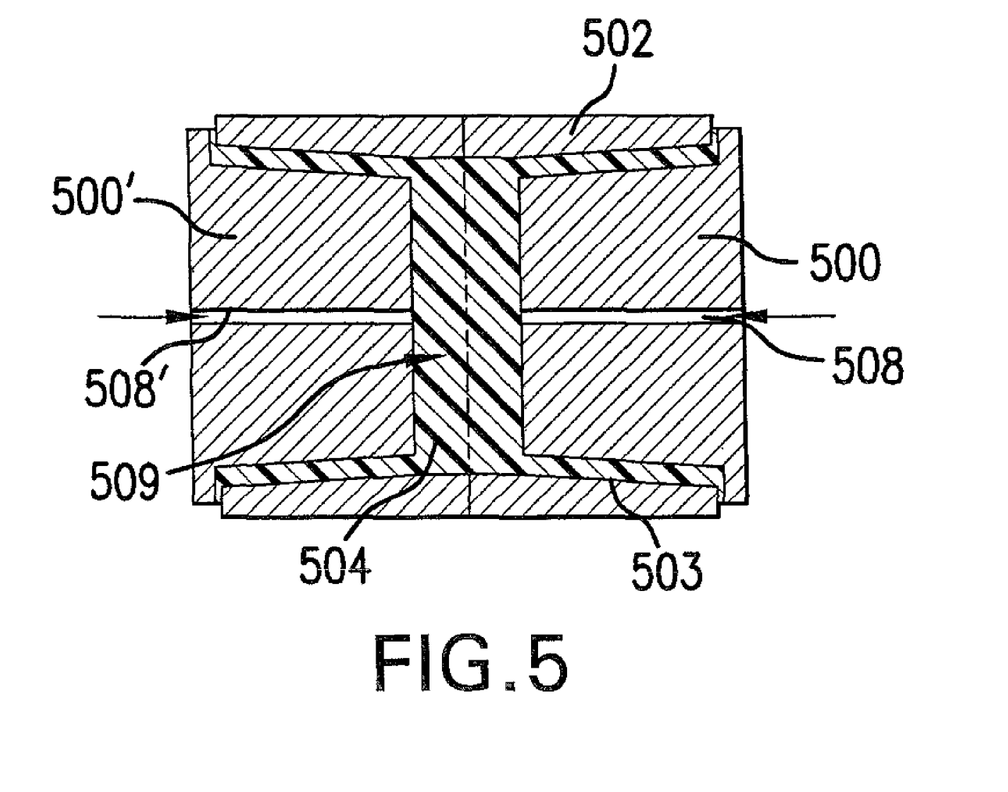
FIG. 5 is a sectional view of a multiple casting mold.

A so-called twin mold is illustrated in FIG. 5 as an example of a multiple casting mold. This casting mold has an outer part 502 and respective cores 500 and 500' on both sides, with which the outer part is closed. The outer part is further clad along its inner surfaces with a silicone cladding 503 according to a first aspect of the invention. Both cores have central through-going duct passages 508 and/or 508', through which the shaping chamber 504 is filled. Also water removal occurs through the core, since the outer part with the watertight cladding 503 permits no or only a small amount of diffusion of water into the gypsum. A small amount of diffusion is possible when the cladding is perforated.

After removal the green glass product is divided along the dashed line 509 by sawing device, for example a saw rope, into two containers.

The multiple mold according to FIG. 5 may be advantageously combined with a duct or canal system, as shown previously in FIG. 3. A pressure difference and an overpressure and/or a low pressure can generally be applied, even without a duct or canal system, in which a large area vacuum apparatus (vacuum bell) is connected to one or both front outer surface of one or both cores 500, 500'. In this case larger flow paths through core and thus greater pressure losses through core must be accepted. Also the pressure difference along the shaping surfaces of the core is very different, when the duct or canal system is eliminated.

A slip mass suitable for the described methods, which are built up with grain sizes under 10.2 mm. Grains with a size over 10.2 mm may only be present in small amounts, because they interfere with the casting process.

The slip masses described in Table I below are suitable for casting in a process of the above-described type. The grain size distribution and the water content of the slip prior to casting are reported in Table I, each in percent by weight.

TABLE 1

| GRAIN SIZE DISTRIBUTION AND WATER CONTENT OF THE SLIP | | | | | | |
|---|---|---|---|---|---|---|
| GRAIN SIZE | MASS 1 | MASS 2 | MASS 3 | MASS 4 | MASS 5 | MASS 'TOTAL' |
| <0.3 mm | 37.0% to 67.5% | 37.0% to 67.5% | 9% to 10% | 28% to 40% | 4% to 38% | 4% to 80.5% |
| 0.3 to 1.0 mm | 28% to 59% | 17.5% to 52% | 76% to 80% | 21% to 66% | 20% to 80% | 17.5% to 80% |
| 1.0 to 3.0 mm | 4% to 8% | 0% to 20% | 10% to 15% | 0% to 48% | 5% to 45% | 0% to 48% |
| 3.0 to 6.0 mm | <1% | 0 to 15% | 0% | <1% | 0 to 14% | 0 to 15% |
| 6.0 to 10.2 mm | <1% | <2% | 0% | 0% | <2% | <2% |
| Water content of the slip (in relation to the weight of the glass part) | 7% to 15% | 8% to 15% | 8% to 15% | 9% to 15% | 7% to 15% | 7% to 15% |

The dependence of the porosity of the cast body on the water content of the slip body after combustion with a combustion temperature of 1150° C. was measured for a slip mass with a grain size distribution like that of slip mass 1. The porosity ranges of the cast body for a given slip water content are as follows:

15% water content: open porosity 11.0% to 14.7%,
12% water content: open porosity 9.7% to 13.3%,
10% water content: open porosity 8.0% to 12.2%,
7% water content: open porosity 5.8% to 10.2%.

After cast bodies with obvious cracks were already separated prior to sintering, the crack formation in the sintered cast bodies was determined in two testing steps. In a first step the cast body was examined optically for cracks by transmitted light methods. When cracks were detected, the cast body was separated as waste, i. e. it was thrown out. In a second step the cast body was examined by X-ray techniques. Cracks in the edge and corner regions and cracks that are less than 20 mm in length are detectable by X-ray methods but not with transmitted light methods. Furthermore the X-ray image makes inhomogeneities visible, which would arise in the first drying stage by partial de-mixing of the slip because of too slow water removal. Such inhomogeneities or "cloud structures" could lead to later crack formation during use of the crucible. The crucible is used at about 1200° C. in the silicon melt. Conversion of the crucible material into Cristobalite occurs in this temperature range, which leads to shrinkage of the crucible. Inhomogeneities in as much as they can lead to subsequent crack formation, whereby the silicon melt could run out of the crucible, have a negative effect. Cast bodies, in which cracks or inhomogeneities are detectable in these steps, are thus likewise thrown away.

In a conventional casting method, in which the outer part and also the core comprise gypsum with a graphite coating on the shaping or molding surfaces and in which the slip material is fed into the casting mold through an inlet opening from above, no crucible without cracks that was usable for the silicon melt could be produced from the slip mass 1 described in Table I above.

After a casting mold with an inlet opening in the corner of the bottom region was selected, the yield of crack-free crucibles increased to 30%. The analysis of the X-ray images prior to sintering showed that material separation and agglomeration occurred with the conventional casting methods, which produced micro-cracks or cracks at the latest during sintering, while the different grain size distributions led to different shrinkages.

It was shown that a satisfactory yield of at least 90% was attainable by the methods according to the present invention with pressurizing during drying and with waterproof or watertight shaping surfaces of the core. This is due to a very uniform material structure and effective prevention of separation of the materials.

The process parameters for the cast body manufacture do not depend on the geometry of the manufactured part, but on the impurity content of the used raw materials.

The presence of alkali (e.g. sodium) leads to a definite change of the flow properties of the slip and to changes in the sintering behavior.

The flow properties of the slip can be adjusted by an easy modification of the grain size distribution and the water content within the limits given in Table I. The maximum combustion temperature must be lowered with high sodium content. The conversion of amorphous quartz glass to its undesirable crystalline modification is accelerated by the presence of impurities.

The purity of the raw material used in the method according to the invention must typically be at least 99.8% $SiO_2$.

The compositions of raw materials (other than $SiO_2$) given in Table II are known to be advantageous for the manufacturing method:

TABLE II

COMPOSITIONS OF RAW MATERIALS EXCEPT FOR $SiO_2$

| Ingredient | Maximum Allowable Content, % by weight | Typical Content Raw Material 1, % by weight | Typical Content Raw Material 2, % by weight |
|---|---|---|---|
| $Al_2O_3$ | 0.08 | 0.06 | 0.035 |
| CaO | 0.016 | 0.007 | 0.005 |
| $Fe_2O_3$ | 0.0085 | 0.007 | 0.0023 |
| $K_2O$ | 0.009 | 0.007 | 0.0016 |
| MgO | 0.01 | 0.0077 | 0.0015 |
| $Na_2O$ | 0.006 | 0.004 | 0.0021 |

The process parameters for casting the green body are within the following limits.

The filling times of the mold under (hydrostatic) pressure on the slip is (according to crucible mass) between 10 minutes and thirty minutes.

The drying times from the beginning of the casting to removal are from 0.5 minutes to several days. The drying times in the first drying stage during which the core is completely anchored in the mold so that its shaping surfaces are in contact with the slip are between 2 hours and 24 hours. The drying times in the second drying stage, in which a part of the core is raised from the mold and the slip material is no longer in contact with it, are between 36 hours and 3 days. Generally drying too long does not affect the quality of the product.

An overpressure between 0.002 MPa to 0.14 MPa (0.02 bar to 0.14 bar) above normal pressure is used. An additional increase of the pressure does not provide any noteworthy advantage and there is a danger of damage to the product container or mold.

Temperatures are generally room temperature, i.e. temperatures between 16° C. and 32° C.

The resulting green product can—depending on its wall thickness—be burned to obtain a container that can withstand stresses or loads according to the following sintering program.

| Step 1 | Heating from room temperature to 90° C. to 120° C. at 10 to 30 K/min. |
| Step 2 | Maintaining the temperature (depending on the wall thickness of the molded body) from 12 to 96 hours. |
| Step 3 | Heating further to 1030° C. to 1230° C. at 1 K/min to 30 K/min (if necessary with a further holding time according to the wall thickness of the casting body, e.g. 24 hours at 300° C.). |
| Step 4 | Holding time (depending on the wall thickness of the cast body) 0.25 hours to 24 hours |
| Step 5 | Additional heating to the maximum combustion temperature between 1050° C. and 1150° C. at about 1 K/min. |
| Step 6 | Holding at a maximum temperature of 1 hour to 32 hours |
| Step 7 | Cooling at 650° C.; maximum cooling speed: 350 K/min. |
| Step 8 | Cooling to room temperature (which can be unregulated). |

While the invention has been illustrated and described as embodied in a quartz glass body, especially a quartz glass crucible for a melt, and a method and casting mold for making the quartz glass body, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims.

We claim:
1. A method of making a quartz glass body, said method comprising the steps of:
 a) feeding a quartz glass-water mixture into a gypsum casting mold, said gypsum casting mold comprising an outer part and an inner part having respective shaping surfaces for contacting the quartz glass-water mixture and at least one of said inner part and said outer part having a corresponding duct system under at least one of said respective shaping surfaces, said duct system comprising a plurality of ducts in the form of textile tubes and at least one connector for connection of a compressed medium;
 b) drying the quartz glass-water mixture in the gypsum casting mold;
 c) during said drying of step b), putting an overpressure on the quartz glass-water mixture by applying the compressed medium to said corresponding duct system in said at least one of the inner part and the outer part; and
 d) transmitting or communicating said overpressure to the quartz glass-water mixture through said plurality of said ducts of said corresponding duct system in said at least one of the inner part and the outer part;
 e) during said drying of step b), applying a hydrostatic pressure on said quartz glass-water mixture in addition to said overpressure applied during said drying through said duct system; and
 f) after said drying of step b, removing a resulting green glass body from the gypsum casting mold, whereby during said removing a pressure difference is applied across the gypsum casting mold, or a portion thereof;

wherein at least a portion of the shaping surfaces of the inner part are surfaces of a water-impermeable substance.

2. The method as defined in claim 1, further comprising providing a pressure difference across the gypsum casting mold, or a portion of the gypsum casting mold, during said feeding of the quartz glass-water mixture into the gypsum casting mold.

3. The method as defined in claim 1, wherein said outer part is an outer shell, said inner part is a core;

said inner part and said outer part are shaped so that said quartz glass body is a quartz glass crucible; and said quartz glass-water mixture is fed into the gypsum casting mold under the force of gravity from a level above an upper crucible edge and through an inlet opening in the gypsum casting mold.

4. The method as defined in claim 1, wherein said inner part is at least partially clad with a prefabricated mold made from a water-impermeable material.

5. The method as defined in claim 4, wherein said water-impermeable material is polyurethane foam or silicone rubber.

6. The method as defined in claim 1, wherein said inner part is at least partially coated with a water-impermeable coating.

7. The method as defined in claim 6, wherein said water-impermeable coating consists of a polyurethane foam layer or a silicone rubber layer.

8. The method as defined in claim 1, wherein said inner part comprises a combustible material and is burned after said drying.

9. The method as defined in claim 8, wherein said combustible material is polyurethane foam.

10. The method as defined in claim 1, further comprising sintering the resulting green glass body after removing the green glass body from the gypsum casting mold.

11. The method as defined in claim 1, further comprising putting said hydrostatic pressure on said quartz glass-water mixture during said feeding of said quartz glass-water mixture into said gypsum casting mold.

12. The method as defined in claim 11, wherein said hydrostatic pressure is adjusted by selection of a filling height above an upper crucible edge of a quartz glass crucible, said quartz glass body consisting of said quartz glass crucible.

13. The method as defined in claim 1, wherein said overpressure is between 0.002 MPa and 0.14 MPa above standard pressure.

14. The method as defined in claim 1, wherein said overpressure is between 0.01 MPa and 0.02 MPa above standard pressure.

15. The method as defined in claim 1, further comprising putting said quartz glass-water mixture under said overpressure during said feeding as well as during said drying, and wherein said gypsum casting mold is completely filled with said quartz glass-water mixture by said feeding over a time interval of 5 minutes to one hour.

16. The method as defined in claim 1, said wherein said overpressure acts on said quartz glass-water mixture during a first stage of said drying and said inner part is lifted from the green glass body during a second stage of said drying.

17. The method as defined in claim 16, wherein said first stage of said drying is from 2 to 24 hours in duration and said second stage of said drying is from 10 hours to 12 days in duration.

18. The method as defined in claim 1, wherein said quartz glass-water mixture has a water content of at most 15% by weight during said feeding into said gypsum casting mold.

19. The method as defined in claim 1, wherein said compressed medium is compressed air.

\* \* \* \* \*